United States Patent [19]
Fork

[11] Patent Number: 5,418,216
[45] Date of Patent: May 23, 1995

[54] SUPERCONDUCTING THIN FILMS ON EPITAXIAL MAGNESIUM OXIDE GROWN ON SILICON

[76] Inventor: David K. Fork, 2110 Ash St., Palo Alto, Calif. 94306

[21] Appl. No.: 884,999

[22] Filed: May 15, 1992

Related U.S. Application Data

[63] Continuation of Ser. No. 621,325, Nov. 30, 1990, abandoned.

[51] Int. Cl.$^6$ .............................................. C30B 23/02
[52] U.S. Cl. .................... 505/473; 505/474; 505/475; 505/237; 505/238; 117/84
[58] Field of Search ................ 357/4, 5; 505/1, 701, 505/702, 703, 704, 729, 473, 474, 475, 235, 237, 235; 156/610, DIG. 87; 117/84, 106, 107, 108

[56] References Cited

U.S. PATENT DOCUMENTS

| | | | |
|---|---|---|---|
| 5,001,108 | 3/1991 | Taguchi | 357/4 |
| 5,084,438 | 1/1992 | Matsubara et al. | 505/704 |
| 5,132,282 | 7/1992 | Newman et al. | 505/704 |
| 5,173,474 | 12/1992 | Connell et al. | 156/612 |

FOREIGN PATENT DOCUMENTS

| | | |
|---|---|---|
| 61-185808 | 8/1986 | Japan . |
| 61-185809 | 8/1986 | Japan . |
| 62-112350 | 5/1987 | Japan ................. 156/610 |

OTHER PUBLICATIONS

Witanachchi et al. "As-Deposited Y-Ba-Cu-O Superconducting Films on Silicon at 400° C.", Appl. Phys. Lett 54(6) 6 Feb. 1989, pp. 578–580.
Lee et al "High $T_c YBa_2Cu_3O_{7-x}$ Thin Films on Si substrates by DC magnetron Sputtering from a Stoichiometric Oxide Target" *Appl. Phys Lett* vol. 52 No. 26 Jun. 27, 1988 pp. 2263–2264.
Rubin et al "Ion Implantation of Sputtered Y-Ba-Cu-O Films" J. Appl. Phys. 66(8) Oct. 15, 1989 pp. 3940–3942.
Eom et al "Epitaxial and Smooth Films of a-axis $YBa_2Cu_3O_7$" *Science* vol. 249 Reports pp. 1549–1552.
Wu et al "High Critical Currents in Epitaxial $YBa_2Cu_3O_{7-x}$ Thin Films on Silicon with Buffer Layers" *Appl. Phys. Lett* vol. 54(8) Feb. 20, 1989 pp. 754–756.
Berezin et al "$Y_1Ba_2Cu_3O_{7-x}$ Thin Films Grown on Sapphire with Epitaxial MgO Buffer Layers" Appl. Phys. Lett vol. 57(1) Jul. 2, 1990 pp. 90–92.
den Boer et al "Spectroscopic Investigations of High Temp. Superconductors" HTS-FrP52 *Amer. Vacuum Society* 34th Nat'l Symposium. Nov. 6, 1987.
Ohshima et al. "Superconducting and Structural Properties of the New $BaLn_xCuO$ Compound System" *Jap. J. Appl. Phys.* vol. 26(5) May 1987 pp. L815–L817.
Kobayashi et al, "Epitaxial NbN/MgO/Si(GaAs,InP) Tunneling MIS Schottky Diode Fabricated . . . ", Jap. Journal of Applied Physics, Part 2 (letters) Jan. 1987 pp. 250–252.
"Epitaxial Growth of NbN on an Ultrathin MgO/Semiconductor System," by M. Tonouchi, et al., J. Appl. Phys. 62(3), 1 Aug. 1987, pp. 961–966.

*Primary Examiner*—Robert Kunemund
*Attorney, Agent, or Firm*—Flehr, Hohbach, Test, Albritton & Herbert

[57] ABSTRACT

A structure having a silicon substrate with an epitaxially grown magnesium oxide layer on a surface onto which is epitaxially grown, either directly or on an intermediary layer, a layer of high temperature superconducting material.

18 Claims, 2 Drawing Sheets

SUPERCONDUCTING THIN FILMS ON EPITAXIAL MAGNESIUM OXIDE GROWN ON SILICON

This is a continuation of application Ser. No. 07/621,325 filed Nov. 30 1990, now abandoned.

BRIEF DESCRIPTION OF THE INVENTION

This invention relates generally to superconducting thin films and/or conducting films or layers formed on epitaxial MgO grown on silicon, and to a method of forming same.

BACKGROUND OF THE INVENTION

In co-pending application Ser. No. 07/510,699 filed Apr. 18, 1990, entitled SILICON SUBSTRATE HAVING AN EPITAXIAL SUPERCONDUCTING LAYER THEREON AND METHOD OF MAKING SAME, there is described a process for growing epitaxial thin films of high temperature superconducting oxide, yttrium, barium and copper oxide materials, for example YBCO, on a silicon substrate using an intermediate layer of cubic zirconia. Because of their epitaxial nature, these thin films have properties that are far superior to previous work on silicon and are comparable to single crystal in the best YBCO films grown on other substrates. Reproducible films with critical current densities $2 \times 10^6$ A/cm$^2$ at 77° K. are described. Their noise levels are extremely low and well suited to bolometers. Epitaxy is critically important to obtain high quality films due to the degradation of the electrical properties across randomly aligned grain boundaries. Control of the epitaxy and the proper preparation of the silicon surface are disclosed in said co-pending application, which is incorporated herein by reference.

The growth of insulating epitaxial oxides on Si is an expanding research topic with important technological applications. Epitaxy refers to the crystalline alignment of a thin film material with its substrate, which may be a different material with a different crystal structure. The possibilities typically cited for work on insulating layers on Si include metal-insulator-semiconductor structures and three-dimensional integrated circuits. The present invention is directed more specifically to a buffer layer for the growth of high temperature superconductor layers or films on silicon substrates. It is also desirable to provide epitaxially grown insulating films or layers which can etched by wet chemicals such as hydrofluoric acid contrasted to buffer films which must be removed by ion milling, plasma etching, or laser ablation.

OBJECTS AND SUMMARY OF THE INVENTION

It is an object of this invention to provide a silicon substrate having an epitaxial MgO film or layer grown on one surface and to a method of growing same.

It is another object of the invention to provide an epitaxial layer of high temperature superconducting material on an epitaxially grown MgO layer grown on silicon and to a method of forming the same.

Another object of the invention is to provide a superconducting layer epitaxially grown on an intermediate layer formed on epitaxially grown magnesium oxide layer on silicon and to a method of forming same.

The foregoing and other objects of the invention are achieved by a silicon substrate having an epitaxial MgO film grown on one surface thereof with alignment of the crystallographic axis with the underlying silicon substrate.

BRIEF DESCRIPTION OF THE DRAWINGS

The foregoing and other objects of the invention will be more clearly understood from the following description when taken in conjunction with the accompanying drawings.

DETAILED DESCRIPTION OF THE PREFERRED EMBODIMENTS

Figure 1:
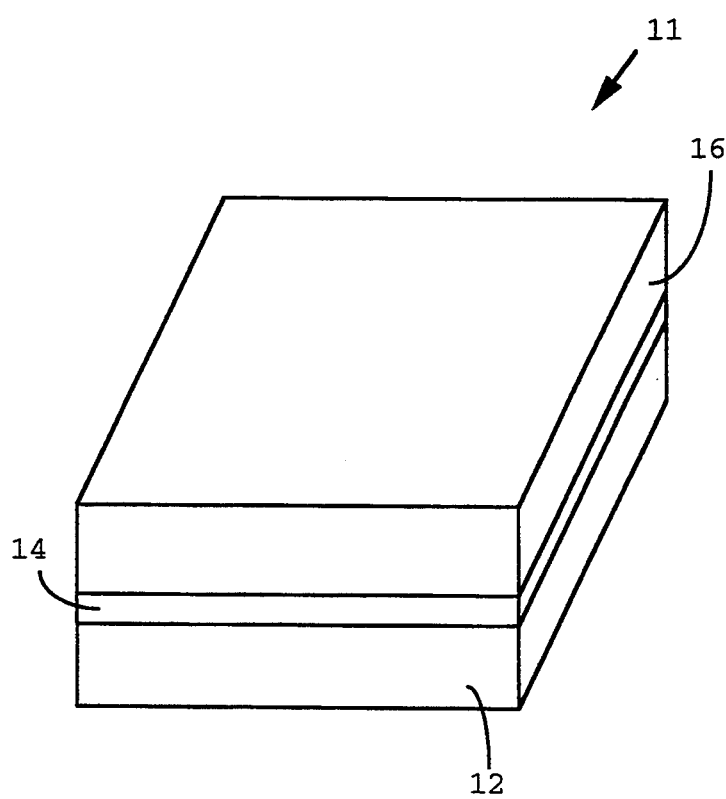
FIG. 1 is a perspective view of a structure in accordance with the invention including a silicon substrate, an epitaxially grown MgO buffer layer and a high temperature, epitaxially grown superconducting superconductor layer thereon.

FIG. 1 is a perspective view of a structure 11 in accordance with the invention. The structure includes a silicon substrate 12 which may have been previously processed to form one or more semiconductor devices of an integrated semiconductor circuit. The processing of such layers to form semiconductor devices is well known in the art and silicon layer can then be processed to form one or more semiconductor devices of an integrated semiconductor circuit. Processing of such layers to form semiconductor devices is well known and may include masking, diffusion, ion implantation or the like.

A barrier or intermediate layer 14 is formed on the surface of the silicon layer and serves to isolate the silicon layer from the overlying structure such as metal interconnects. More specifically, the insulating layer is particularly suitable for the epitaxial growth of high temperature superconducting layers such as layer 16.

In accordance with the invention, the intermediate or barrier layer is an epitaxially grown MgO film or layer. MgO is an insulating crystalline solid with the NaCl structure. The lattice constant of MgO is 4.213 Å, implying a lattice mismatch of about 29 percent with respect to silicon. This lattice mismatch is quite large compared to most epitaxial systems which have been studied previously, expitaxial MgO on Si is an interesting technology because single crystal MgO is a low dielectric substrate for the high temperature cuprate superconductor YBa$_2$Cu$_3$O$_{7-\delta}$ (YBCO). In addition, MgO may provide a suitable host lattice for a variety of other epitaxial materials. MgO can be etched with wet chemicals such as hydrofluoric acid; this may have significant processing advantages.

MgO films were epitaxially grown in a pulsed laser deposition system with a base pressure of $2 \times 10^{-7}$ Torr. Epitaxy requires the removal of the native silicon-oxide. A room temperature technique entitled spin-etching was used for removing the oxide to provide a hydrogen terminated surface prior to loading the Si in the growth chamber. The hydrogen prevents Si oxidation in air, and remains bonded to Si until the substrate is heated above 400 C.

Spin etch technique comprises rotating the silicon wafer and flushing it with a few drops of high purity alcohol, and then etching the surface with a few drops of a mixture of hydrofluoric acid, ethanol and water, all of high purity. The spin etch technique produces an atomically clean surface terminated with one atomic layer of hydrogen. The surface is very passive to contamination or reoxidation even in air, and silicon wafers can be brought to the point of the deposition of the MgO film with ideal surfaces.

The treated silicon wafer is then subjected to an epitaxial growth of magnesium oxide.

Oxide growth by pulsed laser deposition has customarily been carried out using oxide targets. Magnesium metal has been chosen as a target because the absorption of MgO at 308 nm is too low for our laser to ablate the MgO surface. Magnesium metal can be ablated, although its thermal conductivity and reflectance lowers the ablation rate. Magnesium oxidizes readily, making "reactive" laser deposition feasible; its getter effect lowers the pressure while the laser is running. The deposition rate depends strongly on both background $O_2$ pressure and substrate temperature. Pressures from 10 mT to 0,002 mT have been explored. Over this range, at 500 C. the deposition rate dropped from $\sim 0.1$ to 0.01 Å/pulse. Temperatures have been investigated from 300 C. to 600 C.; over this range, the deposition rate dropped from $\sim$six times at the highest temperature.

Preferably, the silicon substrate has a (100) crystallographic orientation because it is the desired orientation for $YBa_2Cu_3O_{7-\delta}$ thin films and because it has the lowest interface state density for field effect devices. On Si (100), the desired MgO (002) reflection is as observed by x-ray diffraction. Only at the highest pressures, where the poorest epitaxy occurred could other MgO reflections be observed. In other words, only MgO (002) and Si peaks were found. Additional x-ray diffraction measurements have shown that the MgO is indeed epitaxial with all the MgO crystal axes aligned to those of Si. Transmission electron microscopy was performed to examine the MgO-Si interface. Electron diffraction images confirmed the epitaxy observed by x-ray diffraction.

To demonstrate the use of this new epitaxial oxide, epitaxial YBCO/MgO/Si has been grown. The YBCO films grown directly on MgO/Si were satisfactory, but were found to have a mixture of two crystal orientations, one with the 11.7 Å c-axis normal to the substrate, and one with the 3.82 Å a-axis normal to the substrate. Although these films were epitaxial, the mixed orientations degraded the electrical properties of the film. YBCO/BaTiO$_3$/MgO/Si thin films were then grown. Although BaTiO$_3$ was used as an intermediate layer between MgO and YBCO, other materials are probably equally suitable, for example, SrTiO$_3$, CaTiO$_3$ and LaAlO$_3$. This resulted in substantially better electrical properties. The normal state resistivity at 300K is 350 $\mu\Omega$-cm. The zero resistance Tc is 83.5K with a width (10–90 percent) of $\sim$2K. Critical current density ($J_c$) was measured on 50 $\mu$m $\times$ 1000 $\mu$m excimer laser patterned lines using a 1 $\mu$V/mm voltage criterion. At 77K, $J_c$ was $6.7 \times 10^5$ A/cm2. This value is close to the best value obtained on silicon using yttria-stabilized zirconia buffer layers. In that case, the critical current density was $2.2 \times 10^6$ A/cm2 at 77K.

Figure 2:
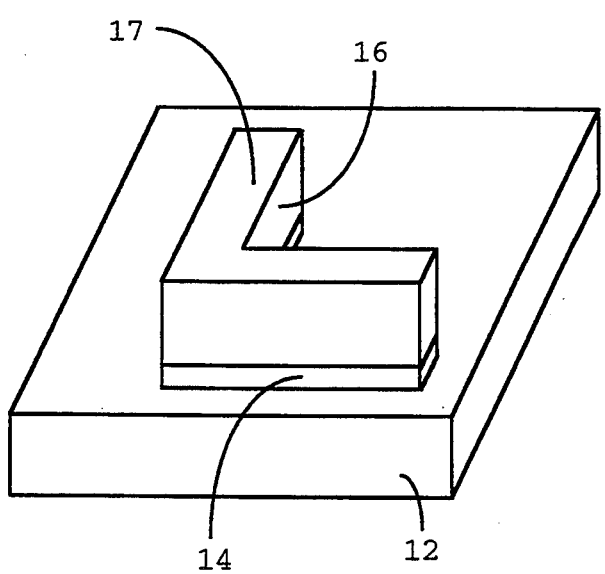
FIG. 2 is a perspective view of a structures such as that shown in FIG. 1 in which the silicon substrate comprises an integrated circuit and in which the superconducting layer and MgO layer have been etched to form an interconnect structure for devices within the silicon.

FIG. 2 shows a structure in which the superconducting layer and the MgO layer have been etched to form interconnects 17.

Although this epitaxial system was investigated using pulsed laser deposition, a variety of techniques may likely be suited for making epitaxial MgO on silicon. These include molecular beam epitaxy, chemical vapor deposition, electron beam evaporation and sputtering.

Although we have demonstrated use of MgO as a buffer layer for growing the high temperature superconductor YBCO, it is expected to work for a variety of other oxide superconductors such as $La_{1.85}Sr_{0.15}CuO_4$, Bi—Sr—Ca—Cu—O, Ba—K—Bi—O, and also rare earth substituted versions of YBCO which replace yttrium with Pr, Nd, Pm, Sm, Eu, Gd, Tb, Dy, Ho, Er, Tm, Yb, or Lu.

What is claimed:

1. A method of forming a superconducting layer, comprising the steps of:

epitaxially depositing an MgO layer onto silicon wherein all of the crystal axes of said MgO layer are aligned with the crystal axes of said silicon; and depositing a superconducting layer onto said MgO layer.

2. A method as recited in claim 1 wherein said silicon has a surface, said silicon's surface has a native oxide layer and therefore prior to said step of depositing said epitaxial MgO layer onto said silicon, said method comprises the step of:

removing said native oxide from said silicon's surface.

3. A method as recited in claim 2 further comprising the step of:

providing a hydrogen terminated surface on said silicon's surface.

4. A method as recited in claim 3 wherein said step of removing said native oxide from said silicon's surface and providing a hydrogen terminated surface on said silicon's surface utilizes a spin etching technique.

5. A method as recited in claim 1 wherein said step of depositing said epitaxial MgO layer onto said silicon utilizes a pulsed laser deposition technique.

6. A method as recited in claim 5 further comprising the step of utilizing a magnesium metal target.

7. A method as recited in claim 5 further comprising the step of utilizing a magnesium oxide target.

8. A method as recited in claim 5 wherein said pulsed laser deposition technique is performed with an $O_2$ pressure between $1 \times 10^{-2}$ Torr and $2 \times 10^{-6}$ Torr.

9. A method as recited in claim 1 wherein said step of depositing said epitaxial MgO layer onto said silicon utilizes a molecular beam epitaxy technique.

10. A method as recited in claim 1 wherein said step of depositing said epitaxial MgO layer onto said silicon utilizes a chemical vapor deposition technique.

11. A method as recited in claim 1 wherein said step of depositing said epitaxial MgO layer onto said silicon utilizes a electron beam evaporation technique.

12. A method as recited in claim 1 wherein said step of depositing said epitaxial MgO layer onto said silicon utilizes a sputtering technique.

13. A method as recited in claim 1 wherein said superconducting layer is a thin film of $YBa_2Cu_3O_{7-\delta}$.

14. A method as recited in claim 1 wherein said superconducting layer is an oxide superconductor.

15. A method as in claim 13 in which yttrium is replaced by Nd, Sm, Eu, Gd, Dy, Ho, Er, Yb, or Lu.

16. A method as in claim 13 in which Ytrium is replaced by Pr, thereby providing a semiconducting thin film.

17. A method as recited in claim 13 wherein prior to the step of depositing said $YB_aCu_3O_{7-\delta}$ thin film, said method comprises the step of:

depositing an intermediate layer on said MgO layer, said intermediate layer selected from SrTiO$_3$, BaTiO$_3$, CaTiO$_3$ or LaAlO$_3$.

18. A method as recited in claim 1 wherein said MgO layer is deposited on said silicon at a temperature between 300° C. and 600° C.

* * * * *